United States Patent
Yanase et al.

(10) Patent No.: US 8,362,611 B2
(45) Date of Patent: Jan. 29, 2013

(54) SEMICONDUCTOR MODULE, METHOD FOR MANUFACTURING SEMICONDUCTOR MODULE, AND PORTABLE DEVICE

(75) Inventors: Yasuyuki Yanase, Gifu (JP); Yoshio Okayama, Gifu (JP); Ryosuke Usui, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 308 days.

(21) Appl. No.: 12/679,595

(22) PCT Filed: Sep. 25, 2008

(86) PCT No.: PCT/JP2008/002663
§ 371 (c)(1),
(2), (4) Date: Mar. 23, 2010

(87) PCT Pub. No.: WO2009/041044
PCT Pub. Date: Apr. 2, 2009

(65) Prior Publication Data
US 2010/0207270 A1   Aug. 19, 2010

(30) Foreign Application Priority Data
Sep. 26, 2007   (JP) ................ 2007-250216

(51) Int. Cl.
*H01L 23/488* (2006.01)
(52) U.S. Cl. ........... 257/737; 257/778; 257/E23.023; 438/121
(58) Field of Classification Search ............ 257/737, 257/778, E21.509, E23.023, 738; 438/121
See application file for complete search history.

(56) References Cited

U.S. PATENT DOCUMENTS
7,492,045 B2 *   2/2009   Okayama et al. ............ 257/737

FOREIGN PATENT DOCUMENTS

| | | |
|---|---|---|
| JP | 2000-058594 | 2/2000 |
| JP | 2000-114302 | 4/2000 |
| JP | 2001-257229 | 9/2001 |
| JP | 2004-063808 | 2/2004 |
| JP | 2004-193297 | 7/2004 |
| JP | 2005-503660 | 2/2005 |
| JP | 2007-157795 | 6/2007 |
| WO | WO-02/069372 A2 | 9/2002 |

OTHER PUBLICATIONS

International Preliminary Examination Report on Patentability (I) with an English translation thereof, issued in International Application No. PCT/JP2008/002663 filed Sep. 25, 2008.
Japanese Office Action, and English translation thereof, issued in Japanese Patent Application No. 2007-250216 dated Jun. 12, 2012.

\* cited by examiner

*Primary Examiner* — Roy Potter
(74) *Attorney, Agent, or Firm* — McDermott Will & Emery LLP

(57) ABSTRACT

A semiconductor module is of a structure such that a wiring layer, an insulating resin layer and a semiconductor device are stacked in this order by bonding them together with compression. In the wiring layer, bump electrodes each having a base and a tip portion are provided in positions corresponding respectively to device electrodes of the semiconductor device. The bump electrodes penetrate the insulating resin layer and are electrically coupled to the corresponding device electrodes.

17 Claims, 9 Drawing Sheets

SEMICONDUCTOR MODULE, METHOD FOR MANUFACTURING SEMICONDUCTOR MODULE, AND PORTABLE DEVICE

RELATED APPLICATIONS

This application is the U.S. National Phase under 35 U.S.C. §371 of International Application No. PCT/JP2008/002663, filed on Sep. 25, 2008, which in turn claims the benefit of Japanese Application No. 2007-250216, filed on Sep. 26, 2007, the disclosures of which Applications are incorporated by reference herein.

TECHNICAL FIELD

The present invention relates to a semiconductor module and a manufacturing method for the semiconductor modules.

BACKGROUND TECHNOLOGY

In recent years, with miniaturization and higher performance in electronic devices, demand has been ever greater for further miniaturization of semiconductor devices used in the electronic devices. With such miniaturization of semiconductor devices, it is of absolute necessity that the pitch of electrodes to enable mounting on a wiring board be made narrower. A known method of surface-mounting a semiconductor device is flip-chip mounting in which solder balls are formed on electrodes of the semiconductor device and the solder balls are soldered to an electrode pad of the wiring board. With this flip-chip method, however, there are restrictive factors for the narrowing of the pitch of electrodes, such as the size of the solder ball itself and the bridge formation at soldering. As one structure used to overcome these limitations, known is a structure where a bump structure formed on a substrate is used as an electrode or a via, and the electrodes of the semiconductor device are connected to the bump structure by mounting the semiconductor device on the substrate with an insulating resin, such as epoxy resin, held between the semiconductor device and the substrate (See Patent Document 1, for instance.

[Patent Document 1] Japanese Patent Application Publication No. 2004-193297.

DISCLOSURE OF THE INVENTION

Problems to be Solved by the Invention

When a wiring layer, an insulating resin and a semiconductor device are stacked together in such a manner that a bump structure is embedded into the insulating resin, the bump structure in a conventional example is of such a shape that the tip thereof is sharp-pointed to improve the penetrability thereof into the insulating resin. Accordingly, when a head portion of the bump structure is press-bonded to an electrode of the semiconductor device, the pressure or stress is concentrated on a local area of the electrode thereof and therefore the electrode thereof may be damaged. Also, the height of the bump structures tends to vary and therefore the connection reliability between the bump structure and the electrode may be degraded.

The present invention has been made in view of the foregoing circumstances, and a purpose thereof is to provide a technology by which to reduce the chance of giving damage to the electrodes of a semiconductor device in a semiconductor module, where the wiring layer, the insulating resin and the semiconductor device are stacked together in such a manner that the bump structure is embedded into the insulating resin, and to enhance the connection reliability between the bump structure and the electrode of the semiconductor device.

Means for Solving the Problems

In order to resolve the above-described problems, one embodiment of the present invention relates to a semiconductor module. The semiconductor module comprises: a wiring layer provided with a bump electrode; a semiconductor device provided with a device electrode disposed counter to the bump electrode; and an insulating resin layer disposed between the wiring layer and the semiconductor device, wherein the bump electrode has a base and a tip portion protruding from a top face of the base, and wherein the bump electrode penetrates the insulating resin layer, and the bump electrode is electrically connected to the device electrode.

By employing this embodiment, the tip portion protruding from the top face of the base is in contact with the electrode of the semiconductor device. Thus the chance of damaging the electrode of the semiconductor is reduced and the connection reliability between the bump structure and the electrode of the semiconductor device improves.

In the above-described embodiment, the tip portion may be formed of a metallic material which is more easily deformed under pressure than the base.

In the above-described embodiment, the tip portion may be formed of a metallic material which is plastic deformable.

In the above-described embodiment, the tip portion may be formed of a plurality of layers, and a layer of the tip portion being in contact with the device electrode may be formed of a metallic material which is more easily deformed under pressure than the base.

In the above-described embodiment, the tip portion may be formed of a plurality of layers, and a layer of the tip portion being in contact with the device electrode may be formed of a metallic material which is plastic deformable.

In the above-described embodiment, the area of an interface between the tip portion and the device electrode may be larger than the area parallel to the top face in an interface between the base and tip portion.

In the above-described embodiment, the base may have a recess in the top face, and the tip portion may be in contact with a bottom face of the recess.

In the above-described embodiment, the insulating resin layer may develop plastic flow under pressure.

Another embodiment of the present invention relates to a portable device. This portable device mounts a semiconductor module according to any one of the above-described semiconductor module.

Still another embodiment of the present invention relates to a method for manufacturing a semiconductor module. The method for manufacturing a semiconductor module includes: forming bump electrodes on a metallic sheet by forming bases on the metallic sheet and forming tip portions on top faces of the bases in such a manner as to protrude from the top faces thereof; and press-bonding the metallic sheet and a semiconductor device, where device electrodes are disposed correspondingly to the bump electrodes, with an insulating resin layer held between the metallic sheet and the semiconductor device, and connecting the bump electrodes to the device electrodes in such a manner that the bump electrodes penetrate the insulating resin layer.

In the forming bump electrodes in the method according to the above-described embodiment, the tip portion may be formed such that the tip portion has a surface, in a head portion thereof, which is parallel to a contact surface of the device electrode.

In the forming bump electrodes in the method according to the above-described embodiment, the tip portion may be formed of a metallic material which is more easily deformed under pressure than the base.

In the forming bump electrodes in the method according to the above-described embodiment, the tip portion may be formed of a metallic material which is plastic deformable.

In the forming bump electrodes in the method according to the above-described embodiment, the tip portion may be so formed as to have a plurality of layers, and a layer of the tip portion being in contact with the device electrode may be formed of a metallic material which is more easily deformed under pressure than the base.

In the forming bump electrodes in the method according to the above-described embodiment, the tip portion may be so formed as to have a plurality of layers, and a layer of the tip portion being in contact with the device electrode may be formed of a metallic material which is plastic deformable.

The press-bonding in the method according to the above-described embodiment may be such that the bump electrodes are connected to the device electrodes in a condition where the area of an interface between the tip portion and the device electrode is larger than the area parallel to the top face in an interface between the base and tip portion of the bump electrode.

In the forming bump electrodes in the method according to the above-described embodiment, the base may have a recess in the top face, and the tip portion may be so formed as to protrude in the recess.

In the above-described embodiment, the insulating resin layer may develop plastic flow under pressure.

The forming bump electrodes in the method according to the above-described embodiment may be such that a resin is so laminated as to cover the bases, the resin is heated at a glass transition temperature of the resin or above and the heated resin is fluidized in such a manner that the film thickness of the resin is thicker in the area above a peripheral edge part of the base than in the area above a central part of the base, openings is formed, by etching, in the resin layer disposed above the bases, the tip portion is formed within the opening and, thereafter, the resin is removed.

EFFECT OF THE INVENTION

The present invention reduces chance of giving damage to the electrodes of a semiconductor device in a semiconductor module where a wiring layer, an insulating resin and a semiconductor device are stacked together in such a manner that the bump structure is embedded into the insulating resin, and enhances the connection reliability between the bump structure and the electrode of the semiconductor device.

DESCRIPTION OF THE REFERENCE NUMERALS

Figure 1:
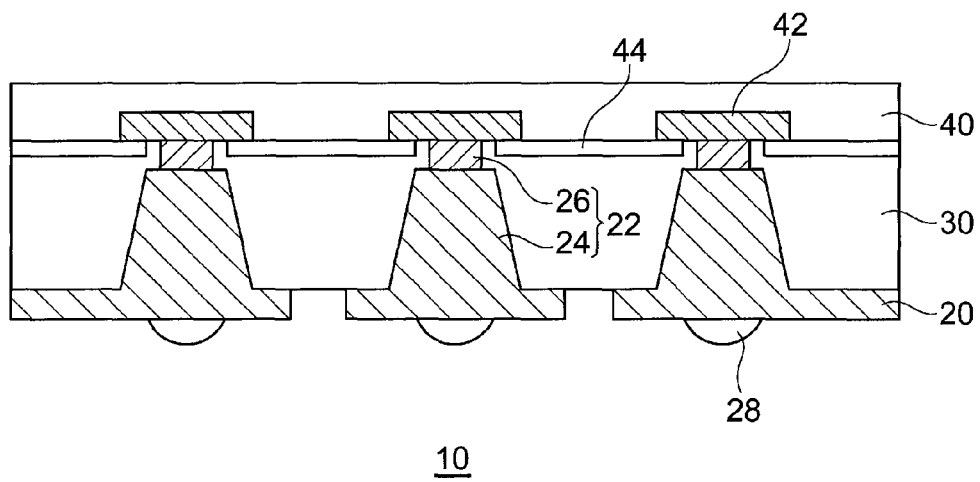
FIG. 1 is a cross-sectional view showing a structure of a semiconductor module according to a first embodiment.

10 Semiconductor module
20 Wiring layer
21 Copper sheet
22 Bump electrode
24 Base
26 Tip portion
27 Recess
28 Solder bump
30 Insulating resin layer
40 Semiconductor device
42 Device electrode
44 Protective layer
60 Resist

BEST MODE FOR CARRYING OUT THE INVENTION

Hereinbelow, the preferred embodiments will be described with reference to the drawings. Note that in all of the Figures the identical or equivalent reference numerals are given to the identical components and the repeated description thereof is omitted as appropriate. Moreover, the embodiments given are for illustrative purposes only and all features and their combination thereof described in the present embodiments are not necessarily essential to the invention.

(First Embodiment)

FIG. 1 is a cross-sectional view showing a structure of a semiconductor module 1 according to a first embodiment. In a wiring layer 20, bump electrodes 22 are provided in positions corresponding respectively to device electrodes 42 of a semiconductor device 40. Solder bumps 28 are provided on an outer-surface side of area where the bump electrodes 22 are formed, respectively.

The bump electrode 22 has a base 24 and a tip portion 26 protruding from a top face of the base 24 disposed parallel to a contact surface of the device electrode 42 (described later).

The base 24 is formed integrally with the wiring layer 20. The wiring layer 20 and the base 24 are each formed by conductive material, preferably a rolled metal such as rolled copper. The base 24 has a side surface formed with increasingly smaller diameter toward a head portion.

The tip portion 26 is formed either by the use of a metallic material, which is more easily deformed under pressure than the rolled copper forming the base 24, by electrolytic plating or electroless plating, or the use of a conductive paste such as a copper paste, a silver paste or a gold paste. Examples of the metallic material which is easily deformable when pressurized than the base 24 include, in particular, a metallic material which can develop plastic deformation and a metallic material whose Vickers hardness (Hv) 80 kgf/mm$^2$ or above, such as Au and Sn. According to the structure and properties implemented herein, the pressure against the device electrode 42 at the time when the bump electrode 22 is press-bonded to the device electrode 42 can be absorbed by the tip portion 26 through a deformation of the tip portion 26. As a result, the possibility of damaging the device electrodes 42 can be reduced and therefore the mounting reliability improves.

The tip portion 26 is protruded in a region within an outer edge of the top face of the base 24. In other words, the tip portion 26 is protruded in such a manner that the top face of the base 24 is exposed. With this structure, the contact area between an insulating resin layer 30 (described later) and a bump electrode 22 increases in comparison with a case where the entire top surface of the base 24 is covered with tip portion 26. Hence the adhesion between the insulating resin layer 30 and the bump electrode 22 improves. Since the tip portion 26 is protruded in a region within the outer edge of the top face of the base 24 in such a manner that the top face of the base 24 is exposed, the bump electrode 22 as a whole is shaped such that it gets thinner toward the head. This enhances the penetrability of the bump electrode 22 into the insulating resin layer 30. The head of the tip portion 26 has a surface parallel to the contact surface of the device electrode 42. Thus, the possibility of damaging the device electrode 42 when the bump electrode 22 is press-bonded to the device electrode 42 can be reduced as compared with a case where the tip of the bump electrode 22 is sharp-pointed.

Similar to the side surface of the base 24, the side surface of the tip portion 26 may also be shaped such that it gets thinner toward the head. This structure further enhances the penetrability of the bump electrode 22 into the insulating resin layer 30. The height of the tip portion 26 is equal to or greater than the width of a protective layer 44 (described later) of the semiconductor device 40. This reduces the possibility that the bump electrode 22 may contact with the protective layer 44 to be described later, and therefore the connection reliability between the bump electrode 22 and the device electrode 42 improves.

The bump electrode 22 penetrates the insulating resin layer 30 and is electrically connected to the device electrode 42 disposed in the semiconductor device 40.

The insulating resin layer 30 is provided between the wiring layer 20 and the semiconductor device 40. One face of the insulating resin layer 30 is press-bonded to the wiring layer 20, whereas the other face thereof is press-bonded to the semiconductor device 40. The insulating resin layer 30 is formed of a material that develops plastic flow when pressurized. An example of the material that develops plastic flow when pressurized is epoxy thermosetting resin. The epoxy thermosetting resin to be used for the insulating resin layer 30 may be, for example, one having viscosity of 1 kPa·s under the conditions of a temperature of 160° C. and a pressure of 8 MPa. If a pressure of 15 MPa is applied to this material at a temperature of 160° C., then the viscosity of the resin will drop to about 1/8 of that before the pressurization. In contrast to this, under a condition that the temperature is below a glass transition temperature Tg, an epoxy resin in B stage before thermosetting has no viscosity similarly to a case when the resin is not pressurized, and the epoxy resin develops no viscosity even when pressurized.

In the semiconductor module 10 according to the present embodiment, a material that develops plastic flow when pressurized is used as the insulating resin layer 30. Thus, when the wiring layer 20, the insulating resin layer 30 and the semiconductor device 40 are press-bonded in this order and formed integrally with one another, the probability that the residual film of insulating resin layer 30 will remain at an interface between the bump electrode 22 and the device electrode 42 is reduced. Thus the connection reliability improves.

The semiconductor device 40 is press-bonded to the insulating resin layer 30 in a manner such that an electrode surface thereof provided with the device electrode 42 is disposed toward an insulating resin layer 30 side. The protective layer 44 of the semiconductor device 40 is stacked on the semiconductor device 40 such that the protective layer 44 has openings for the device electrodes 42. A specific example of the semiconductor device 40 is a semiconductor chip such as an integrated circuit (IC) or a large-scale integrated circuit (LSI). A specific example of the protective layer 44 is a polyimide layer.

(Manufacturing Method of Semiconductor Module)

FIGS. 2A to 2E are cross-sectional views showing a process in a method for forming the bump electrodes 22.

Figure 2A:
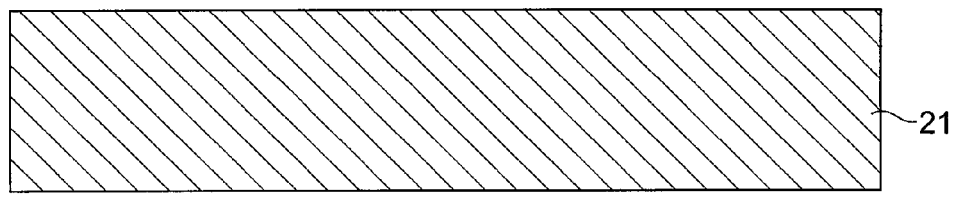
FIGS. 2A to 2E are cross-sectional views showing a process in a method for forming bump electrodes.

As shown in FIG. 2A, a copper sheet 21 having the thickness at least larger than the sum of the height of the base 24 of the bump electrode 22 and the thickness of the wiring layer 20 is prepared.

Figure 2B:
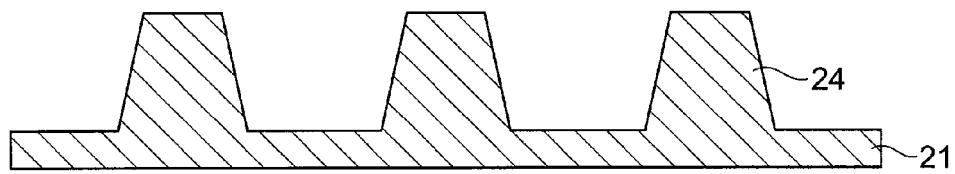

Then, as shown in FIG. 2B, a resist (not shown) is selectively formed on an electrode forming area by a lithography method, and the bases 24 of a predetermined pattern is formed on the copper sheet 21 using the resist as a mask. The bases 24 are provided in positions corresponding respectively to the positions of device electrodes 42 formed on the semiconductor device 40 (See FIG. 3A).

Figure 2C:
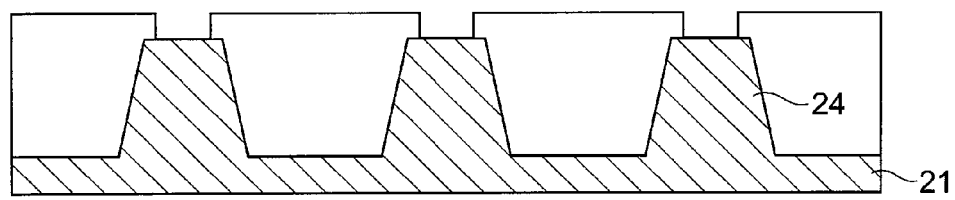

Next, as shown in FIG. 2C, the resist is laminated on a base 24 side of the copper sheet 21, and this resist is exposure-developed by the lithography method using a photomask so as to open the resist positioned above the bases 24.

Figure 2D:
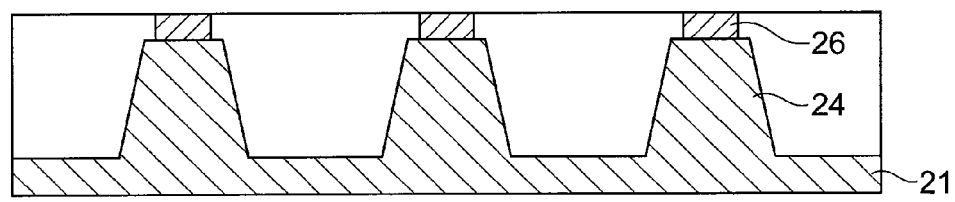

Then, as shown in FIG. 2D, the tip portion 26 is formed within an opening of the resist. The tip portion 26 is formed by electrolytic plating or electroless plating as a Au/Ni metallic layer, for instance. The film thickness of Au and Ni are 4.5 μm and 0.5 μm, respectively. In so doing, the tip portion 26 is formed in such a manner that the Ni layer is positioned at a side being in contact with the base 24 while the Au layer is positioned at a side being in contact with the device electrode 42. As described above, the tip portion 26 is formed of a plurality of layers, and a layer being in contact with the device electrode 42 is formed of a material which is more easily deformed under pressure than the base 24, such as Au, which can particularly develop plastic deformation.

Though the shape of the tip portion 26 in the Figures is rectangular as viewed in cross section, the shape thereof is not particularly limited to this shape. For example, the tip portion 26 may be shaped in such a manner that the diameter thereof becomes smaller as the side surface thereof approaches the tip thereof. In such a case, for example, a negative resist is used as the resist, and the resist is selectively exposed in an over-exposed condition so as to provide openings there. This process forms a metallic layer in each of the openings, so that the tip portion 26 can be formed which is shaped such that the diameter thereof becomes smaller as the side surface thereof approaches the tip thereof. Alternatively, the arrangement may be such that openings the size of which is larger than that of the tip portion 26 is provided in the resist to form a metallic layer and then this metallic layer is etched. As a result, the tip portion 26 having the similar shape can be formed.

When the tip portion 26 is formed by electrolytic plating or electroless plating, the direction of crystal grains of a metal that forms the tip portion 26 is aligned in the vertical direction to the contact surface of the device electrode 42. Thus, the tip portion 26 can absorb the pressure against the device electrode 42 at the time when the bump electrode 22 is press-bonded to the device electrode 42. As a result, the possibility of damaging the device electrodes 42 can be reduced. Note that the method of forming the tip portions 26 is not particularly limited to that described above and, for example, the tip portions 26 may be formed using a conductive paste such as a copper paste, a silver paste or a gold paste. Regardless of any method employed, the bump electrodes 22 having little variation in the height thereof can be easily formed as compared with the case where the tip of the bump electrode 22 is sharp-pointed. Thus, the connection reliability between the bump electrode 22 and the device electrode 42 can be improved.

Figure 2E:
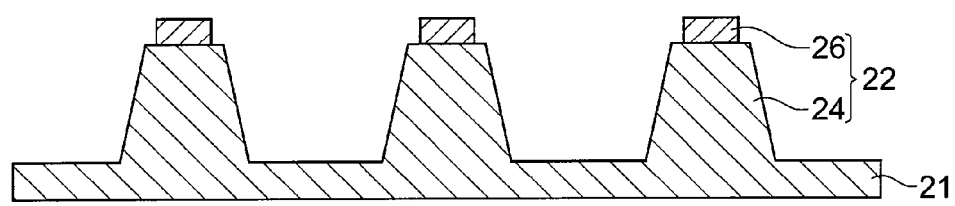

Then, as shown in FIG. 2E, the resist is removed. The bump electrodes 22 are formed through the above-described fabrication processes.

In the present embodiment, the height of the base 24 of the bump electrode 22, the diameter at the base surface thereof and the diameter at the top surface thereof are 50 µm, 60 µmφ and 40 µmφ, respectively. The height of the tip portion 26 and the diameter thereof are 5 µm and 30 µmφ, respectively.

FIGS. 3A to 3D are cross-sectional views showing a process in a method for connecting the bump electrodes 22 and the device electrodes 42 and a process in a method for forming the wiring layer 20.

Figure 3A:
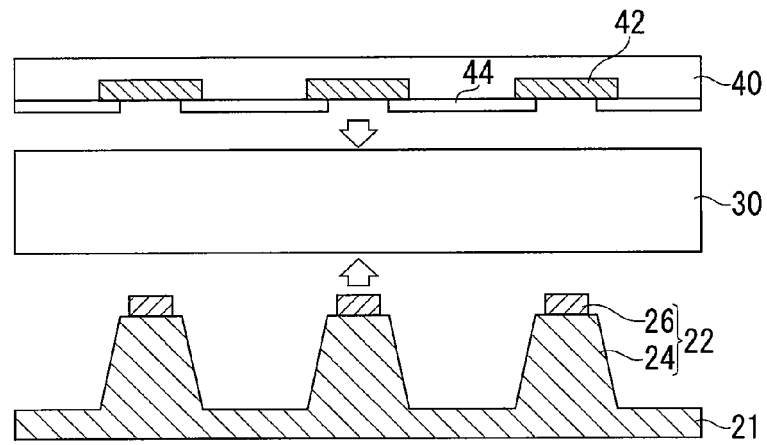
FIGS. 3A to 3D are cross-sectional views showing a process in a method for connecting bump electrodes and device electrodes and a process in a method for forming a wiring layer.

As shown in FIG. 3A, an insulating resin layer 30 is held between a semiconductor device 40, where device electrodes 42 having predetermined patterns are formed, and a copper sheet 21, where the bump electrodes 22 are fabricated using the above-described method. The film thickness of the insulating resin layer 30 is approximately equal to the height of the base 24. The semiconductor device 40, the insulating resin layer 30 and the copper sheet 21 are press-formed by a press machine into a single block. The pressure and the temperature for the press-forming are about 15 Mpa and 180° C., respectively. The press-forming causes the bump electrodes 22 to penetrate the insulating resin layer 30, so that the bump electrodes 22 and the device electrodes 42 are electrically coupled to each other. The bump electrode 22, whose overall shape is narrower toward the tip thereof, penetrates the insulating resin layer 30 smoothly. The tip portion 26 has a surface parallel to the contact surface of the device electrode 42. Thus, as compared with the case where the tip of the bump electrode 22 is sharp-pointed, the bump electrode 22 can be brought into contact with the device electrode 42 over a larger area when the bump electrode 22 and the device electrode 42 are press-bonded to each other. As a result, the pressure or stress is not concentrated on the local area of the device electrode 42 and therefore the possibility of damaging the device electrode 42 can be reduced.

Figure 3B:
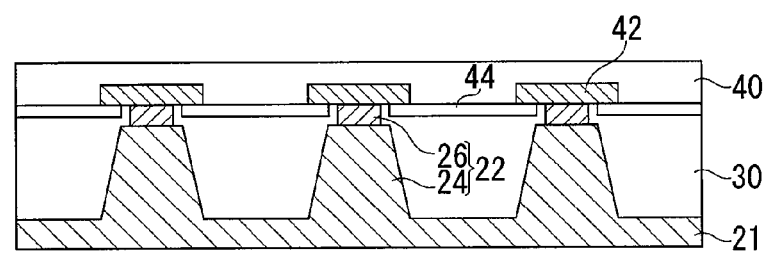

Then, as shown in FIG. 3B, the copper sheet 21 is adjusted into the thickness of the wiring layer 20 by etching the whole of the reverse side of the copper sheet 21. The thickness of the wiring layer 20 according to the present embodiment is 20 µm.

Figure 3C:
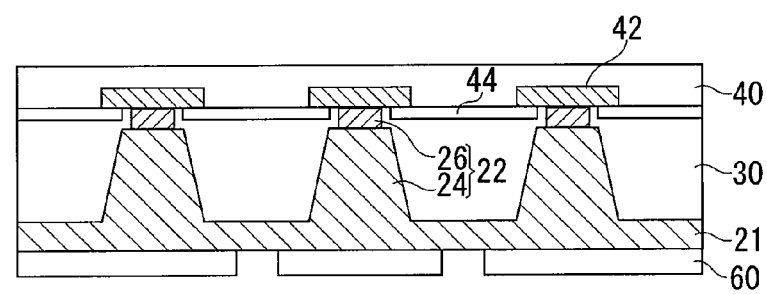

Next, as illustrated in FIG. 3C, resists 60 are selectively formed according to the patterns of wiring layer 20 by the lithography method. More specifically, a resist film whose thickness is 20 µm is affixed to the copper sheet 21 by a laminator apparatus, and it is UV-exposed using a photo mask having the patterns of wiring layer. After this, the resists in the unexposed areas are removed by a development using a Na$_2$CO$_3$ solution, which will selectively form the resists 60 on the copper sheet 21. To improve the adhesion of the resists 60 to the copper sheet 21, it is desirable that a pretreatment, such as grinding, cleaning and the like, be performed as necessary on the surface of the copper sheet 21 before the lamination of the resist film thereon.

Figure 3D:
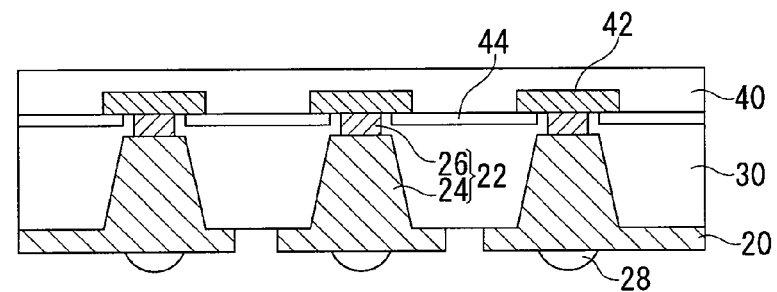

As shown in FIG. 3D, etching is done to an exposed part of the copper sheet 21, using a ferric chloride solution to form wiring layers 20 having predetermined wiring patterns. The resists are removed using a stripping agent, such as an NaOH solution, and then the solder bumps 28 are formed in predetermined positions of the wiring layer 20 connected to the bump electrodes 22. Note that the predetermined positions in which the solder bumps 20 are formed may be targeted positions where circuit wiring is extended through a rewiring.

The semiconductor module 10 as shown in FIG. 1 is formed through the above-described processes.

(Second Embodiment)

Figure 4:
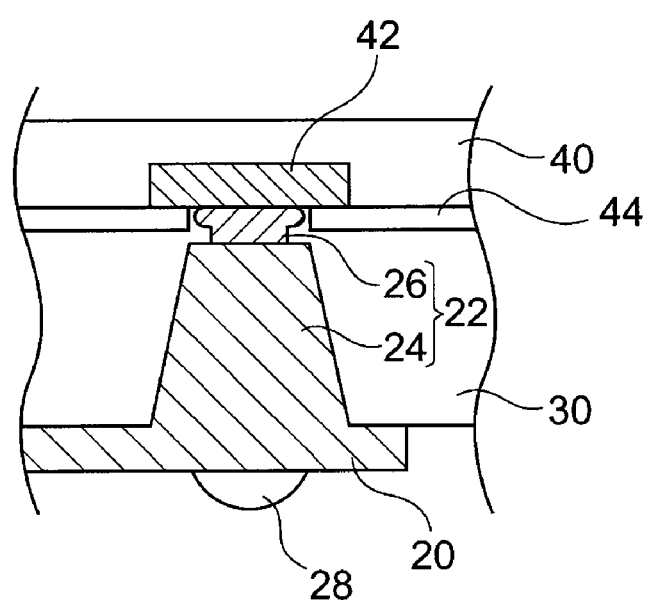
FIG. 4 is a partially enlarged cross-sectional view of a semiconductor module according to a second embodiment.

FIG. 4 is a partially enlarged cross-sectional view of a semiconductor module 10 according to a second embodiment. In the semiconductor module 10 according to the present embodiment, a tip portion 26 is deformed due to the press-boding of the tip portion 26 and a device electrode 42. Thus the area of the interface between the tip portion 26 and the device electrode 42 is larger than the area parallel to the top face of a base 24 in the interface between the base 24 and tip portion 26. As a result, the connection reliability between the bump electrode 22 and the device electrode 42 can be improved.

The method for manufacturing the semiconductor module 10 according to the second embodiment is basically the same as that according to the first embodiment. By varying a press-forming condition, the tip portion 26 can be deformed through the press-bonding of the bump electrode 22 and the device electrode 42.

(Third Embodiment)

Figure 5:
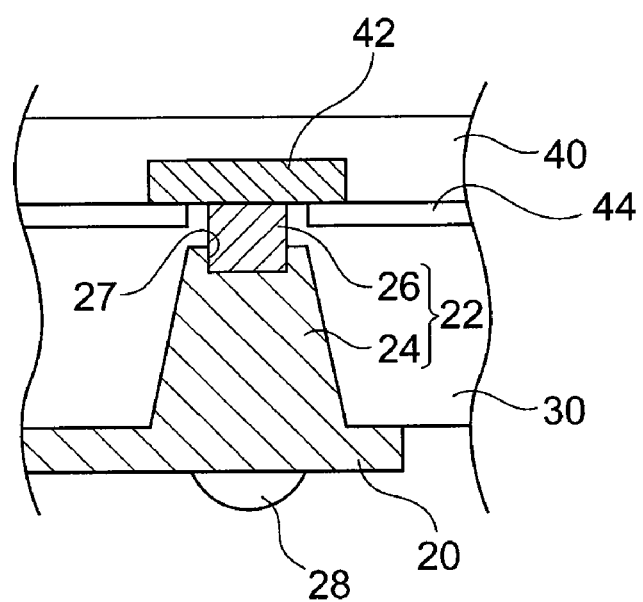
FIG. 5 is a partially enlarged cross-sectional view of a semiconductor module according to a third embodiment.

FIG. 5 is a partially enlarged cross-sectional view of a semiconductor module 10 according to a third embodiment. In the semiconductor module 10 according to the present embodiment, a recess 27 is provided in a top face of a base 24 of a bump electrode 22, and a tip portion 26 is so formed as to be protruded inside the recess 27.

The method for manufacturing the semiconductor module 10 according to the third embodiment is basically the same as that according to the first embodiment. In the present embodiment, the base 24 is formed on the copper sheet 21, and then the recess 27 is formed in the top face of the base 24. For example, the recess 27 is formed by wet-etching the top face of the base 24. Then the tip portion 26 is formed in the recess 27. Alternatively, the tip portion 26 is formed by displacement plating. That is, the copper located in a predetermined position of the top face of the base 24 is displaced, and a metallic layer is formed. As a result, formed is the tip portion 26 which is in contact with the bottom of the recess 27 and which is protruded from the top face of the base 24.

This structure enhances the adhesion between the base 24 and the tip portion 26 and thereby improves the connection reliability of the semiconductor module 10.

(Fourth Embodiment)

In the above-described first embodiment, the resist is laminated on the base 24 side of the copper sheet 21, and this resist is exposure-developed by the lithography method using a photomask so as to open the resist positioned above the bases 24 and form the tip portion 26 in the opening. According to a fourth embodiment, the tip portion 26 may be formed as follows.

FIGS. 6A to 6D are cross-sectional views showing a process in a method for forming the device electrodes 22 according to the fourth embodiment.

Figure 6A:
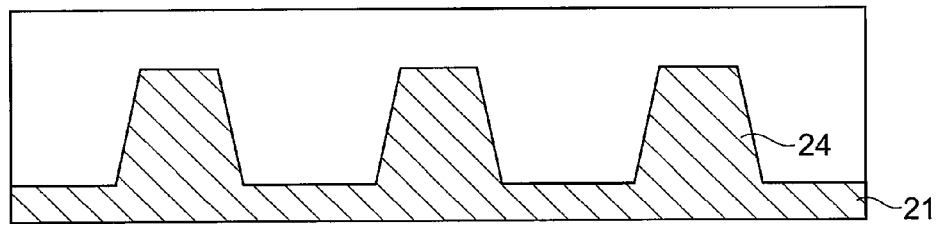
FIGS. 6A to 6D are cross-sectional views showing a process in a method for forming bump electrodes according to a fourth embodiment.

As shown in FIG. 6A, a resin, such as the aforementioned epoxy thermosetting resin, is laminated on the copper sheet 21, in which the bases 24 have been formed similarly to the first embodiment, in such a manner as to cover the bases 24.

Figure 6B:
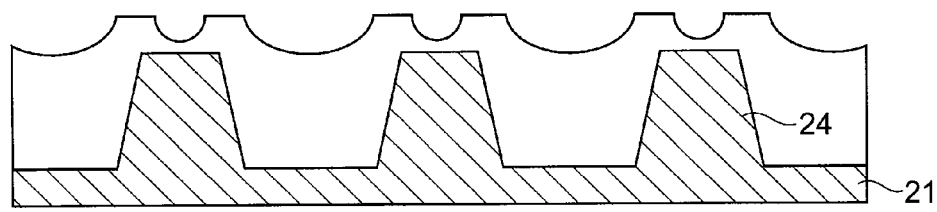

As shown in FIG. 6B, the epoxy thermosetting resin is heated at the glass transition temperature Tg of the epoxy thermosetting resin or above. Then the heated epoxy thermosetting resin is fluidized in such a manner that the film thickness of an epoxy thermosetting resin layer is thicker in the area above a peripheral edge part of the base 24 than in the area above a central part of the base 24.

Figure 6C:
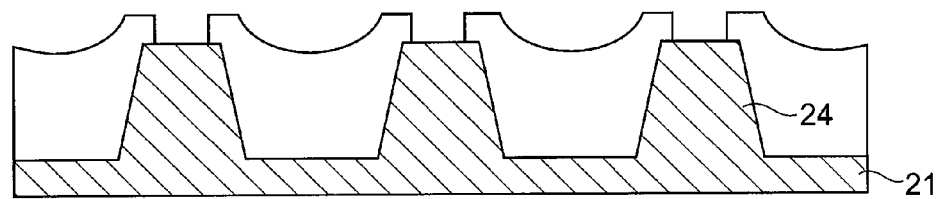

Then, as shown in FIG. 6C, the whole of the epoxy thermosetting resin layer is etched to form openings in the epoxy thermosetting resin layer disposed above the bases 24.

Figure 6D:
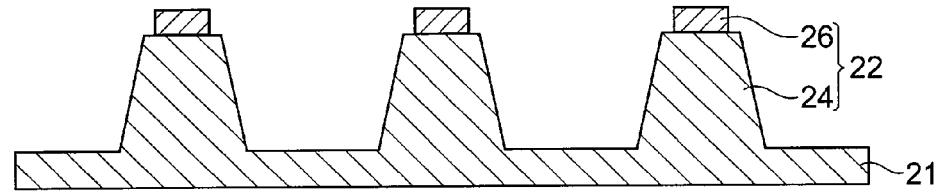

Then, as shown in FIG. 6D, the tip portion 26 is formed within the opening of the epoxy thermosetting resin layer by electrolytic plating or electroless plating, and the epoxy thermosetting resin layer is removed. The bump electrodes 22 are formed through the above-described fabrication processes.

The method for connecting the bump electrodes 22 to the device electrodes 42 and the method for forming the wiring layer 20 according to the present embodiment are similar to those according to the first embodiment.

According to the present embodiment, the bump electrodes 22 can be formed in a simpler and easier way.

(Fifth Embodiment)

Though, in the above-described first embodiment, the base 24 and tip portion 26 of the bump electrode 22 are formed separately, the base 24 and the tip portion 26 may be formed integrally with each other as shown in the present embodiment.

Figure 7:
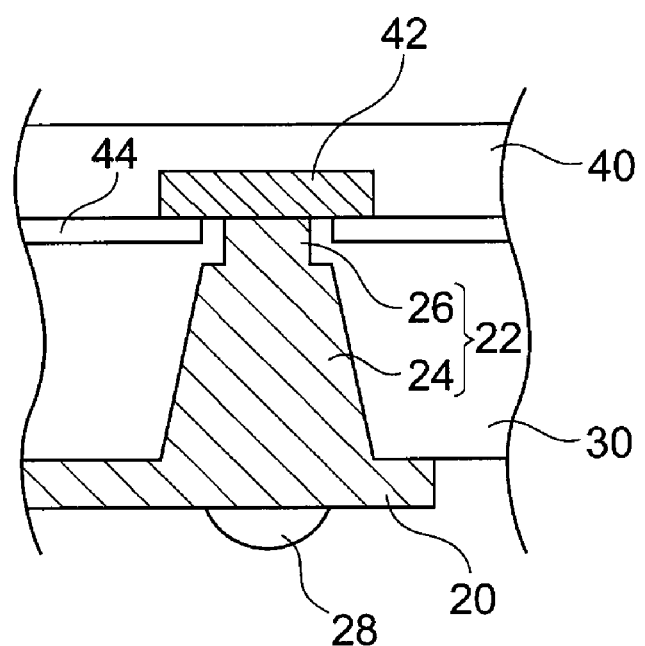
FIG. 7 is a partially enlarged cross-sectional view of a semiconductor module according to a fifth embodiment.

FIG. 7 is a partially enlarged cross-sectional view of a semiconductor module 10 according to a fifth embodiment. In the semiconductor module 10 according to the present embodiment, the base 24 and the tip portion 26 of the bump electrode 22 are formed integrally with each other.

In the present embodiment, when the bump electrode 22 is to be formed, the base 24 and the tip portion 26 are formed integrally with each other as follows. That is, the base 24 and the tip portion 26 are formed integrally with each other in such a manner that a projection larger than the base 24 is formed in the copper sheet 21 and then a projection structure is formed on the head of this projection by etching the projection.

According to the present embodiment, the bump electrodes 22 can be formed in a simpler and easier way.

(Sixth Embodiment)

Next, a description will be given of a mobile apparatus (portable device) provided with a semiconductor module according to the above described embodiments. The mobile apparatus presented as an example herein is a mobile phone, but it may be any electronic apparatus, such as a personal digital assistant (PDA), a digital video camera (DVC) or a digital still camera (DSC).

Figure 8:
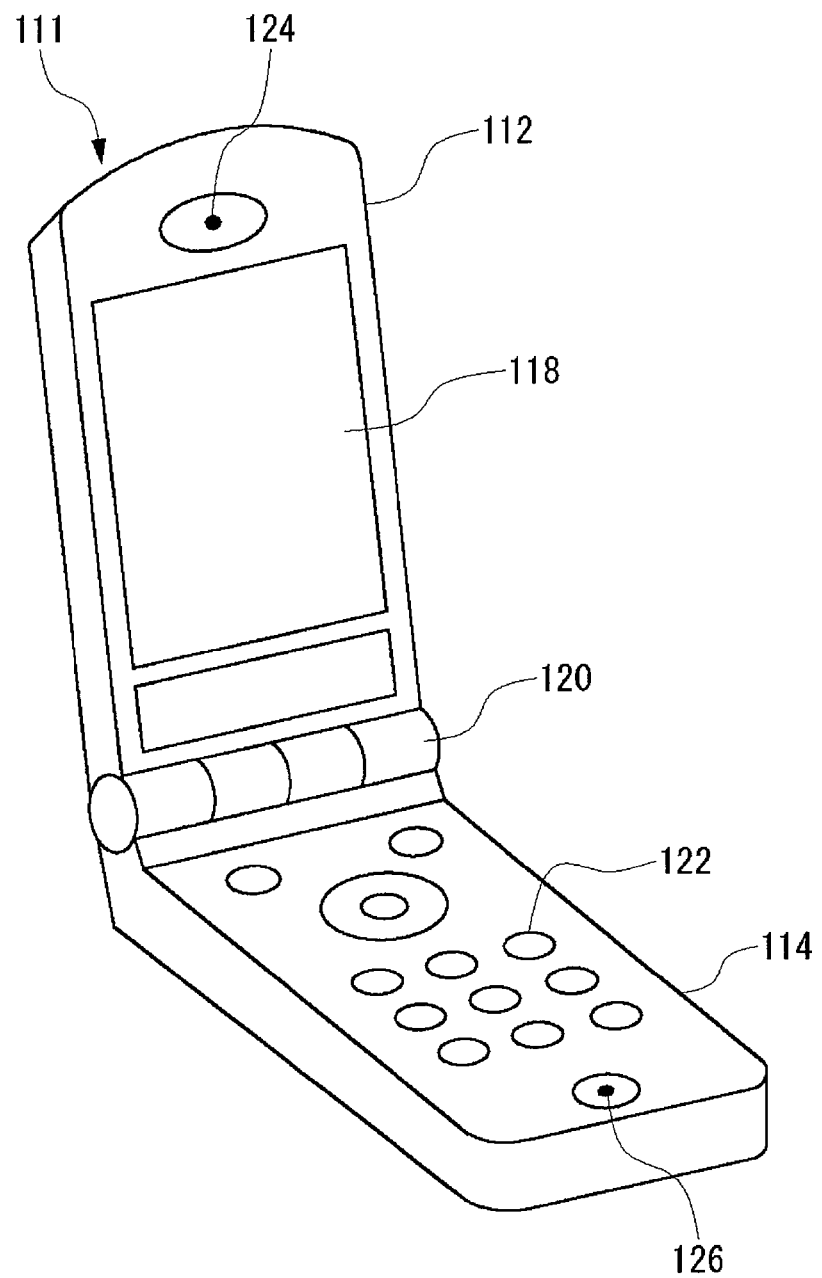
FIG. 8 illustrates a structure of a mobile phone according to a sixth embodiment.

FIG. 8 illustrates a structure of a mobile phone provided with a semiconductor module according to the preferred embodiments of the present invention. A mobile phone 111 has a structure of a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and a microphone 126. Note that the semiconductor module according to each of the preferred embodiments of the present invention is mounted within a mobile phone 111 such as this.

Figure 9:
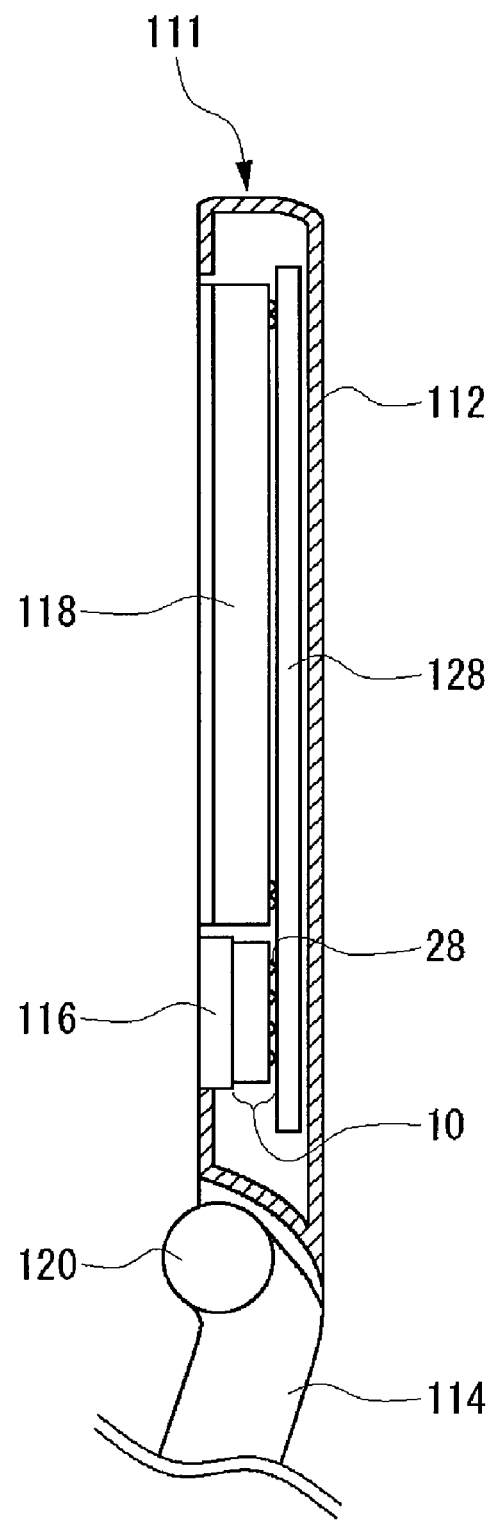
FIG. 9 is a partial cross-sectional view of a mobile phone.

FIG. 9 is a partial cross-sectional view (cross-sectional view of the first casing 112) of the mobile phone shown in FIG. 8. The semiconductor module 30 according to each of the preferred embodiments of the present invention is mounted on a printed circuit board 128 via the solder bumps 28 and is coupled electrically to the display unit 118 and the like by way of the printed circuit board 128. Also, a radiating substrate 116, which may be a metallic substrate, is provided on the back side of the semiconductor module 10 (opposite side of solder bumps 28), so that the heat generated from the semiconductor module 10, for example, can be efficiently released outside the first casing 112 without getting trapped therein.

By employing the mobile apparatus according to the sixth embodiment of the present invention, the connection reliability between the bump electrode 22 and the device electrode 42 improves and therefore the connection reliability in the semiconductor module 10 improves. Thus the reliability of the mobile apparatus mounting such a semiconductor module 10 improves.

The present invention is not limited to the above-described embodiments, and it is understood by those skilled in the art that various modifications such as changes in design may be made based on their knowledge and the embodiments added with such modifications are also within the scope of the present invention.

In each of the above-described embodiments, the wiring layer and base are formed integrally with each other but, for example, the base may be formed separately and may be provided in the wiring layer by press-boding them together.

In each of the above-described embodiments, the wiring layer has a single layer but this should not be considered as limiting and it may be multilayered.

In the above-described embodiments, the solder bumps are formed on the outermost face of the wiring layer. However, this should not be considered as limiting and, for example, a MOS transistor may be bonded to the wiring layer, and a source electrode, a drain electrode and a gate electrode of the MOS transistor may be electrically connected to the wiring layer.

Also, a means for electrically connecting between different wiring layers through the medium of an insulating resin layer, which develops plastic flow under pressure, using the bump electrodes as described above is applicable to a process for manufacturing semiconductor packages, which is called a wafer-level CSP (Chip Size Package) process. Thus, the semiconductor module can be made thinner and smaller.

Industrial Applicability

The present invention proves useful in the field of manufacturing a semiconductor module where a wiring layer, an insulating resin and a semiconductor device are stacked together.

What is claimed is:

1. A semiconductor module, comprising:
    a wiring layer provided with a bump electrode;
    a semiconductor device provided with a device electrode disposed counter to the bump electrode; and
    an insulating resin layer disposed between said wiring layer and said semiconductor device, wherein:
    the bump electrode has a base and a tip portion protruding from a top face of the base,
    the bump electrode penetrates said insulating resin layer, and the bump electrode is electrically connected to the device electrode,
    the tip portion is formed of a plurality of layers, and
    a layer of the tip portion being in contact with the device electrode is formed of a metallic material which is plastic deformable.

2. A semiconductor module according to claim 1, wherein the tip portion is formed of a metallic material which is more easily deformed under pressure than the base.

3. A semiconductor module according to claim 1, wherein the tip portion is formed of a metallic material which is plastic deformable.

4. A semiconductor module according to claim 1,
wherein a layer of the tip portion being in contact with the device electrode is formed of a metallic material which is more easily deformed under pressure than the base.

5. A semiconductor module according to claim 3, wherein the area of an interface between the tip portion and the device electrode is larger than the area parallel to the top face in an interface between the base and tip portion.

6. A semiconductor module according to claim 1, wherein the base has a recess in the top face, and
the tip portion is in contact with a bottom face of the recess.

7. A semiconductor module according to claim 1, wherein the insulating resin layer develops plastic flow under pressure.

8. A method for manufacturing a semiconductor module, the method including:
forming bump electrodes on a metallic sheet by forming bases on the metallic sheet and forming tip portions on top faces of the bases in such a manner as to protrude from the top faces thereof; and
press-bonding the metallic sheet and a semiconductor device, where device electrodes are disposed corresponding respectively to the bump electrodes, with an insulating resin layer held between the metallic sheet and the semiconductor device, and connecting the bump electrodes to the device electrodes in such a manner that the bump electrodes penetrate the insulating resin layer,
wherein the tip portion is so formed as to have a plurality of layers, and a layer of the tip portion being in contact with the device electrode is formed of a metallic material which is more easily deformed under pressure than the base.

9. A method for manufacturing a semiconductor module according to claim 8, wherein, in said forming bump electrodes, the tip portion is formed such that the tip portion has a surface, in a head portion thereof, which is parallel to a contact surface of the device electrode.

10. A method for manufacturing a semiconductor module according to claim 8, wherein, in said forming bump electrodes, the tip portion is formed of a metallic material which is more easily deformed under pressure than the base.

11. A method for manufacturing a semiconductor module according claim 8, wherein, in said forming bump electrodes, the tip portion is formed of a metallic material which is plastic deformable.

12. A method for manufacturing a semiconductor module according to claim 8, wherein, in said forming bump electrodes, the tip portion is so formed as to have the plurality of layers.

13. A method for manufacturing a semiconductor module, the method including:
forming bump electrodes on a metallic sheet by forming bases on the metallic sheet and forming tip portions on top faces of the bases in such a manner as to protrude from the top faces thereof; and
press-bonding the metallic sheet and a semiconductor device, where device electrodes are disposed corresponding respectively to the bump electrodes, with an insulating resin layer held between the metallic sheet and the semiconductor device, and connecting the bump electrodes to the device electrodes in such a manner that the bump electrodes penetrate the insulating resin layer,
wherein the tip portion is so formed as to have a plurality of layers, and
a layer of the tip portion being in contact with the device electrode is formed of a metallic material which is plastic deformable.

14. A method for manufacturing a semiconductor module according to claim 11, wherein said press-bonding is such that the bump electrodes are connected to the device electrodes in a condition where the area of an interface between the tip portion and the device electrode is larger than the area parallel to the top face in an interface between the base and tip portion of the bump electrode.

15. A method for manufacturing a semiconductor module according to claim 8, wherein, in said forming bump electrodes, the base has a recess in the top face, and
the tip portion is so formed as to protrude in the recess.

16. A method for manufacturing a semiconductor module according to claim 8, wherein the insulating resin layer develops plastic flow under pressure.

17. A method for manufacturing a semiconductor module according to claim 8, wherein said forming bump electrodes is such that
a resin is so laminated as to cover the bases,
the resin is heated at a glass transition temperature of the resin or above and the heated resin is fluidized in such a manner that the film thickness of the resin is thicker in the area above a peripheral edge part of the base than in the area above a central part of the base,
an opening is formed, by etching, in the resin layer disposed above the bases,
the tip portion is formed within the opening, and thereafter, the resin is removed.

* * * * *